US012695423B2

(12) United States Patent
Köllmann

(10) Patent No.: US 12,695,423 B2
(45) Date of Patent: Jul. 28, 2026

(54) MULTICORE ROTARY TRAVELING WAVE OSCILLATOR

(71) Applicant: NXP B.V., Eindhoven (NL)

(72) Inventor: Andreas Johannes Köllmann, Rosengarten (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 18/650,400

(22) Filed: Apr. 30, 2024

(65) Prior Publication Data

US 2025/0337361 A1      Oct. 30, 2025

(51) Int. Cl.
| | |
|---|---|
| *H03B 5/18* | (2006.01) |
| *H03B 9/08* | (2006.01) |
| *H03K 3/03* | (2006.01) |
| *H03L 7/099* | (2006.01) |

(52) U.S. Cl.
CPC ............. *H03B 9/08* (2013.01); *H03B 5/1847* (2013.01); *H03K 3/0322* (2013.01); *H03L 7/0995* (2013.01)

(58) Field of Classification Search
CPC .. H03B 5/1841; H03B 5/1847; H03B 5/1852; H03B 2200/0024; H03K 3/0315; H03K 3/0322; H03L 7/0995
See application file for complete search history.

(56) References Cited

U.S. PATENT DOCUMENTS 10,312,922 B2      6/2019   Shanan
2002/0149431 A1*   10/2002  Hajimiri .............. H03B 5/1852
                                                331/36 C 2010/0117744 A1*   5/2010   Takinami ................. H03K 3/86
                                                331/45
2010/0253439 A1*   10/2010  Wood ......................... G06F 1/12
                                                331/46
2012/0169427 A1*   7/2012   Emira ................... H03B 5/1852
                                                331/96
2012/0319783 A1*   12/2012  Martchovsky ........... H03B 5/26
                                                331/46

(Continued)

FOREIGN PATENT DOCUMENTS

WO            0167603 A1     9/2001

OTHER PUBLICATIONS

Amir-Reza, S. et al., "Analysis and Design of a Multi-Core Oscillator for Ultra-Low Phase Noise", IEEE Transactions on Circuits and Systems-I: Regular Papers, vol. 63, No. 4; Apr. 2016; pp. 529-539.

(Continued)

*Primary Examiner* — Levi Gannon

(57) ABSTRACT

Techniques, circuits, and systems related to a multicore rotary traveling wave oscillator (RTWO) are provided. The multicore RTWO includes at least two metal layers and multiple RTWO cores, such that each core comprises a set of differential signal conductors that are interleaved across the metal layers to optimize space and reduce parasitic effects. The relative positional configuration of these differential signal conductors varies across a range of directionalities and/or orientations. In embodiments, an oscillator output signal is generated by the multicore RTWO; the frequency of this oscillator output signal is adjusted based on a comparison of its phase with that of a reference signal, such as within a phase locked loop circuit.

19 Claims, 7 Drawing Sheets

(56) References Cited

U.S. PATENT DOCUMENTS

| | | | |
|---|---|---|---|
| 2015/0180455 A1* | 6/2015 | Beccue | H03K 3/0315 331/57 |
| 2017/0264241 A1* | 9/2017 | Dedic | H03K 3/0315 |
| 2023/0198468 A1* | 6/2023 | Honkote | H03B 9/08 331/46 |

OTHER PUBLICATIONS

Chang, H. et al., "Phase Noise in Coupled Oscillators: Theory and Experiment", IEEE Transactions on Microwave Theory and Techniques, vol. 45, No. 5; May 1997; pp. 604-615.

Kang, Z. et al., "A 5mW 30GHz Quasi-Rotary Traveling-Wave Oscillator with Extrinsic-Q-Enhanced Transmission Line", IEEE Transactions on Circuits and Systems-I: Regular Papers, vol. 70, No. 10; Oct. 2023; pp. 3867-3878.

Kuttappa, R. et al., "RotaSYN: Rotary Traveling Wave Oscillator SYNthesizer", IEEE Transactions on Circuits and Systems-I: Regular Papers, vol. 66, No. 7; Jul. 2019; pp. 2685-2698.

Li, H. et al., "A 19.1-25.5GHz Compact Dual-Mode Rotary Traveling-Wave Oscillator with 195.4dBc/Hz FoMT", IEEE Microwave and Wireless Components Letters, vol. 32, Issue 11, Nov. 2022; pp. 1347-1350.

Moroni, A. et al., "Analysis and Design of a 54GHz Distributed 'Hybrid' Wave Oscillator Array with Quadrature Outputs", IEEE Journal of Solid-State Circuits, vol. 49, No. 5; May 2014; pp. 1158-1172.

Peng, Y.Y. et al., "An Area-Efficient CRLH (Composite Right/Left-Handed)-TL Approach to the Design of Rotary Traveling-Wave Oscillator", IEEE Microwave and Wireless Components Letters, vol. 23, No. 10; Oct. 2013; pp. 560-562.

Shanan, H. et al., "A 9 to 12GHz Coupled-RTWO FMCW ADPLL with 97fs RMS Jitter, -120dBc/Hz PN at 1MHz Offset and with Retrace Time of 12.5ns and 2us Chirp Settling Time", IEEE International Solid-State Circuits Conference (ISSCC), Session 8, Advanced RF Building Blocks 8.3; Feb. 2022; 3 pages.

Takinami, K. et al., "A Distributed Oscillator Based All-Digital PLL with a 32-Phase Embedded Phase-to-Digital Converter", IEEE Journal of Solid-State Circuits, vol. 46, No. 11; Nov. 2011; pp. 2650-2660.

Vigilante, M. et al., "A Coupled-RTWO-Based Subharmonic Receiver Front End for 5G E-Band Backhaul Links in 28nm Bulk CMOS", IEEE Journal of Solid-State Circuits, vol. 53, No. 10; Oct. 2018; pp. 2927-2938.

Wood, J. et al., "Rotary Travelling-Wave Oscillator Arrays: A New Clock Technology", IEEE Journal of Solid-State Circuits, vol. 36, No. 11; Nov. 2001; pp. 1654-1665.

Ansari, Kimia T. et al.; "Ku-Band igh Output Power Multiphase Rotary Travelling-Wave VCO in SiGe BiCMOS; Proceedings of the 8th European Microwave Integrated Circuits Conference"; Nuremberg, DE; 4 pages (Jun. 10-Aug. 2013).

Wood, John et al; "Giga-Hertz Rate Single Slope Conversion Technique with 512-Phase RTWO"; Analog Integrated Circuits and Signal Processing, Kluwer Academic Publishers BO, vol. 55, No. 2; pp. 139-148 (Mar. 12, 2008).

* cited by examiner

IMPROVED 4-CORE RTWO

320

200

312

200

310

200

312

200

PREVIOUS 4-CORE RTWO

200

SINGLE CORE RTWO

MULTICORE ROTARY TRAVELING WAVE OSCILLATOR

BACKGROUND

Among various oscillator designs, the Rotary Traveling Wave Oscillator (RTWO) is typically used to generate well-aligned multi-phase clock signals for many high-speed digital, analog, and mixed-signal circuits. RTWOs are often constructed using a differential circular transmission line and cross-coupled inverters or latches, which operate in tandem to restore energy dissipated as a square wave travels along the ring, thus maintaining the oscillation.

In many applications (e.g., All-Digital Phase Locked Loops (AD-PLLs)), RTWOs offer a seamless integration with Time-to-Digital Converters (TDCs), facilitating the generation of digital phase relation information without excessive calibration. This integration enables maintaining precise control over the oscillator's frequency and phase, enabling accurate clock generation and synchronization across various system components.

SUMMARY OF SELECTED EMBODIMENTS

In embodiments, a multicore rotary traveling wave oscillator (RTWO) comprises at least two metal layers and a plurality of RTWO cores. Each RTWO core of the plurality of RTWO cores comprises a set of differential signal conductors, such that the differential signal conductors for the plurality of RTWO cores are interleaved via the at least two metal layers.

The set of differential signal conductors for each RTWO core may be oriented across a range of directions, such that the interleaved differential signal conductors have a first relative positional configuration where the interleaved differential signal conductors are substantially oriented in a first direction, and a different second relative positional configuration where the interleaved differential signal conductors are substantially oriented in a second direction. The range of directions may be up to 360 degrees. The first relative positional configuration may include multiple conductors positioned in an inner portion of the interleaved differential signal conductors, while the second relative positional configuration includes at least one of the multiple conductors positioned in an outer portion of the interleaved differential signal conductors.

A first subset of the differential signal conductors for the plurality of RTWO cores may have a first cross-sectional area, and a second subset of the differential signal conductors for the plurality of RTWO cores may have a second cross-sectional area that is different than the first cross-sectional area. The differential signal conductors with the first cross-sectional area may be positioned on an inner track of the at least two metal layers and the differential signal conductors, with the differential signal conductors having second cross-sectional area being positioned on an outer track of the at least two metal layers. The differential signal conductors with the first cross-sectional area may be positioned on a first metal layer of the at least two metal layers and the differential signal conductors, with the differential signal conductors having second cross-sectional area being positioned on a second metal layer of the at least two metal layers.

A first subset of the differential signal conductors for the plurality of RTWO cores may have a first spacing distance between conductors, such that a second subset of the differential signal conductors has a second spacing distance between conductors that is different than the first spacing distance.

The multicore RTWO may be configured to, responsive to a control signal, activate a first subset of RTWO cores the plurality of the RTWO cores while a second subset of the plurality of RTWO cores is inactive.

The multicore RTWO may be configured to, responsive to a control signal, deactivate a first subset of the plurality of the RTWO cores while a second subset of the plurality of RTWO cores continues operation.

The plurality of RTWO cores may comprise N RTWO cores, such that each RTWO core of the plurality of RTWO cores occupies an area A of the at least two metal layers, and such that the multicore RTWO occupies a total area T of the at least two metal layers that is less than N×A.

In embodiments, a system comprises a multicore rotary traveling wave oscillator (RTWO) and a phase-locked loop (PLL) circuit coupled to the RTWO. The multicore RTWO may comprise at least two metal layers and a plurality of RTWO cores, such that each core comprises a set of differential signal conductors, and such that the differential signal conductors for the plurality of RTWO cores are interleaved via the at least two metal layers. The PLL circuit is to stabilize the frequency of one or more RTWO signals generated by the RTWO by comparing a phase of the one or more RTWO signals with a reference signal.

The set of differential signal conductors for each RTWO core may be oriented across a range of directions, such that the interleaved differential signal conductors have a first relative positional configuration where the interleaved differential signal conductors are substantially oriented in a first direction, and have a different second relative positional configuration where the interleaved differential signal conductors are substantially oriented in a second direction. The range of directions may comprise 360 degrees. The first relative positional configuration may include multiple conductors positioned in an inner portion of the interleaved differential signal conductors, such that the second relative positional configuration includes at least one of the multiple conductors positioned in an outer portion of the interleaved differential signal conductors.

A first subset of the differential signal conductors for the plurality of RTWO cores may have a first cross-sectional area, such that a second subset of the differential signal conductors for the plurality of RTWO cores has a second cross-sectional area that is different than the first cross-sectional area. The differential signal conductors with the first cross-sectional area may be positioned on an inner track of the at least two metal layers, with the differential signal conductors having the second cross-sectional area being positioned on an outer track of the at least two metal layers.

A first subset of the differential signal conductors for the plurality of RTWO cores may have a first spacing distance between conductors, such that a second subset of the differential signal conductors has a second spacing distance between conductors that is different than the first spacing distance.

The system may further comprise a controller to selectively activate or deactivate a subset of one or more RTWO cores of the plurality of the RTWO cores.

The plurality of RTWO cores may comprise N RTWO cores, such that each RTWO core of the plurality of RTWO cores occupies an area A of the at least two metal layers, and such that the multicore RTWO occupies a total area T of the at least two metal layers that is less than N×A.

In embodiments, a method comprises generating an oscillator output signal using a multicore rotary traveling wave oscillator (RTWO), the multicore RTWO comprising at least two metal layers and a plurality of RTWO cores, each RTWO core comprising a set of differential signal conductors, and the differential signal conductors for the plurality of RTWO cores being interleaved via the at least two metal layers; and adjusting a frequency of the oscillator output signal based on a comparison of a phase of the oscillator output signal with a reference signal.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

As used herein, phase noise refers to the random fluctuations in the phase of a signal, compared to a perfect reference signal, that are spread around a carrier frequency over a range of frequencies. These fluctuations are caused by short-term variations in the frequency of the oscillator generating the signal, leading to noise that manifests as phase jitter or timing instability in the output signal. Phase noise in oscillators and timing circuits can significantly impact the performance and reliability of communication systems, radar, and other electronic devices that rely on precise timing and signal integrity. High phase noise can degrade signal quality, reduce signal-to-noise ratio, and ultimately limit the effectiveness of the system in which the oscillator is used. Reducing phase noise is therefore advantageous in the design of oscillators for high-frequency and high-precision applications.

Some applications require lower phase noise performance than achievable with a single oscillator. Combining multiple coupled oscillators is a known means to reduce phase noise (random fluctuations in the phase of a signal). However, despite this and other advantages offered by multi-core RTWOs, their practical implementation faces a major hurdle: the nearly linear scaling of the required silicon area with the number of implemented oscillators. This scaling not only increases the cost but also limits the integration density, posing a significant challenge for incorporating RTWOs into compact system-on-chip (SoC) designs and other integrated circuits where space is at a premium.

Figure 1:
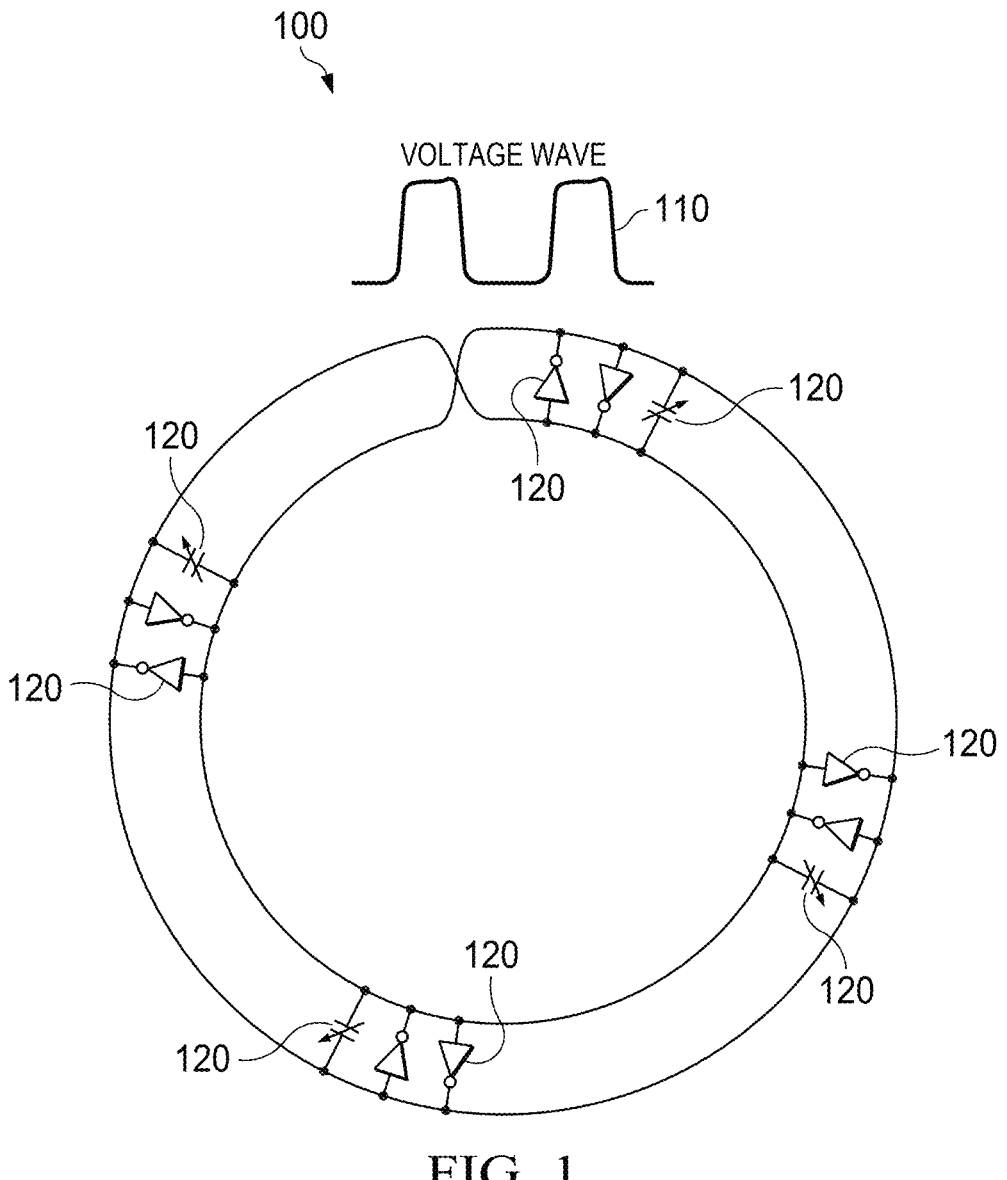
FIG. 1 illustrates a simplified RTWO in which a square voltage wave travels along a differential circular transmission line.

FIG. 1 illustrates a simplified RTWO 100, in which a square voltage wave 110 travels along a differential circular transmission line 105 that substantially forms a ring. In the depicted configuration, four cross-coupled inverters (latches) 120 restore the energy dissipated as the square wave 110 travels along the ring. This arrangement produces a single clock edge which sweeps around the ring formed by the differential transmission line 105 at a frequency dependent on the electrical length of the ring.

Figure 2:
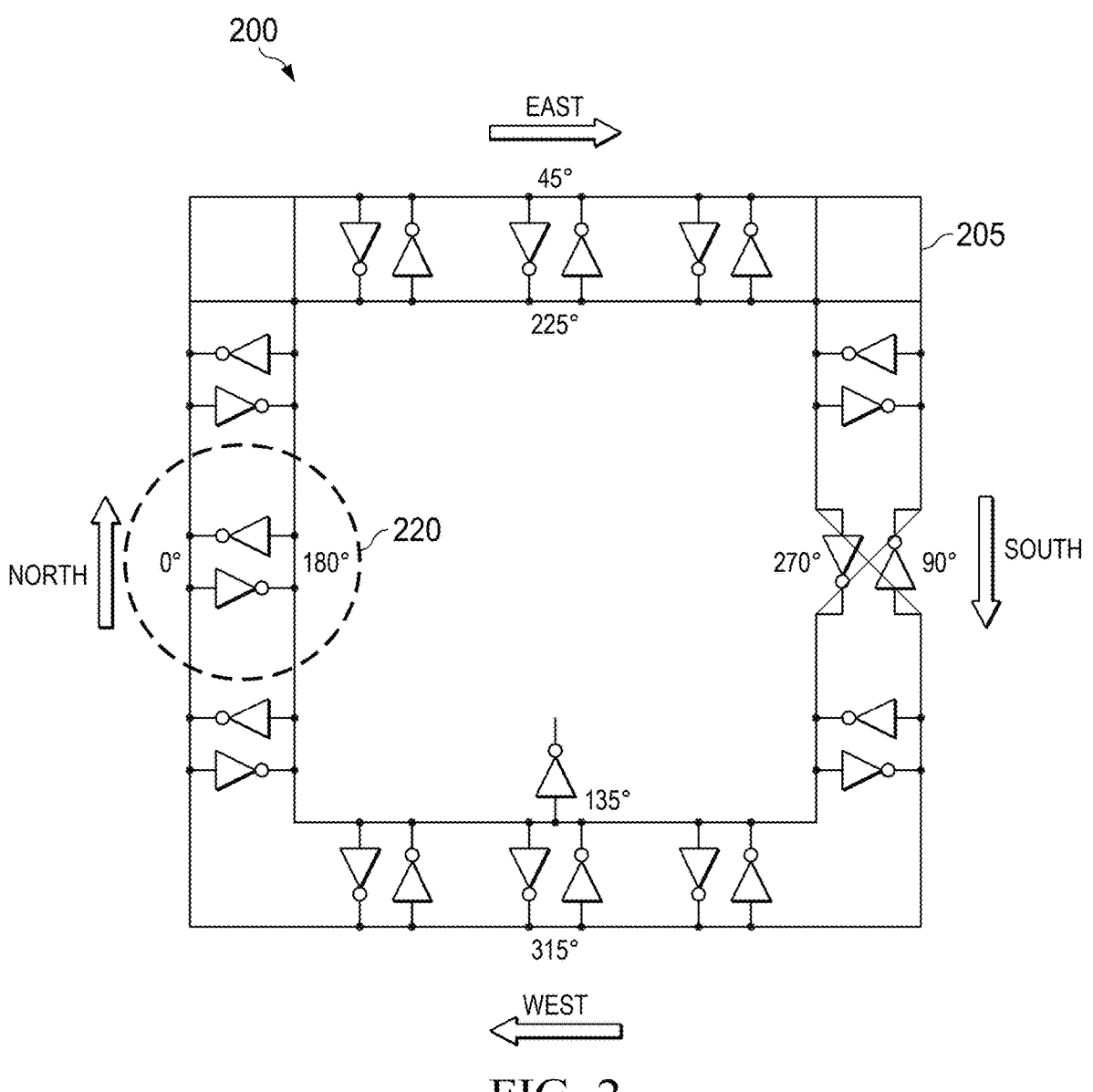
FIG. 2 illustrates a logical schematic version of an RTWO comprising a plurality of latches distributed around a square path formed by a differential transmission line.

FIG. 2 illustrates a logical schematic version of the RTWO 100, with a plurality of twelve latches 220 distributed around a square path formed by differential transmission line 205. The phase of a square wave (not shown) traveling along the differential transmission line 205 is indicated at the midpoint of each side of its path.

As is understood, coupling N multiple oscillators can reduce phase noise (PN) by a factor of up to $\Delta PN = 10 \cdot \log_{10} N$, thereby enhancing the overall stability and performance of the oscillator system. However, such multi-core oscillator configurations, while reducing phase noise, traditionally suffer from increased silicon area usage, posing significant design and economic challenges, especially as the demand for miniaturization and cost-effectiveness in electronics continues to grow.

Implementations of techniques, systems, and circuits described herein provide RTWO designs that overcome the limitations of conventional multi-core RTWOs, such as in terms of silicon area usage, without compromising on characteristics such as phase noise reduction and multi-phase clock generation capabilities. Generally, in an RTWO formed via two or more metal layers, embodiments of techniques described herein include a plurality of RTWO cores that each comprise a set of differential signal conductors, such that the differential signal conductors for the plurality of RTWO cores are interleaved via those metal layers. By leveraging interleaved differential transmission lines and exploiting magnetic and mutual inductive and/or capacitive coupling, embodiments substantially reduce the area footprint of multi-core RTWOs on silicon substrates. This advancement enables the realization of high-performance, scalable oscillators suitable for a wide range of applications, including but not limited to phase-locked loops (PLLs), analog and RF-frontends, and integrated system on chips (SoCs).

In certain embodiments, interleaved transmission lines of the RTWO cores are closely spaced, facilitating effective magnetic or mutual inductive and capacitive coupling between the lines. This approach eliminates the need for additional coupling tracks or devices, such as dedicated capacitors, resistors, or switches, traditionally used to achieve coupling between oscillator cores. By optimizing the spatial arrangement of the transmission lines, embodiments provide a significant reduction in silicon area usage compared to conventional multi-core RTWO designs, in which area scales substantially linearly with the number of cores.

In certain embodiments, the described techniques compensate for asymmetries between the oscillator cores caused by the routing of combined transmission lines. For example, by interchanging the assigned transmission lines of the individual RTWO cores throughout a transmission line ring, each associated transmission line traverses all possible locations along the ring, thereby maintaining overall symmetry and minimizing local mismatches. In some embodiments, four interleaved differential transmission lines for a 4-core RTWO utilize two metal layers. By varying parameters such as track width or distance between differential signals, oscillator design may be optimized for different applications and performance requirements.

In various embodiments, multicore RTWO configurations described herein allow for individual core activation and deactivation, providing scalable performance and power consumption and enabling tailored use of oscillator cores according to the specific needs of the application. For instance, in scenarios demanding lower power consumption, a subset of the RTWO cores can be activated (such as responsive to a control signal from a controller) without significantly impacting the oscillator's overall phase noise performance. Similarly, a first subset of the RTWO cores can be deactivated (such as responsive to a control signal from a controller) while a second subset of the RTWO cores continues operation. In certain embodiments, such individually controllable RTWO cores increase oscillator resolution, such as if their control signals are used as individual controls (rather than switched in parallel, for example). As used herein, oscillator resolution refers to the smallest increment of frequency change that can be achieved or distinguished by the relevant oscillator, defining the precision and adjustability of an oscillator's output signal. Higher resolution in an oscillator allows for finer tuning of the frequency, which is advantageous in applications requiring improved frequency control (e.g., digital communications, signal processing, and precision instrumentation).

Figure 3:
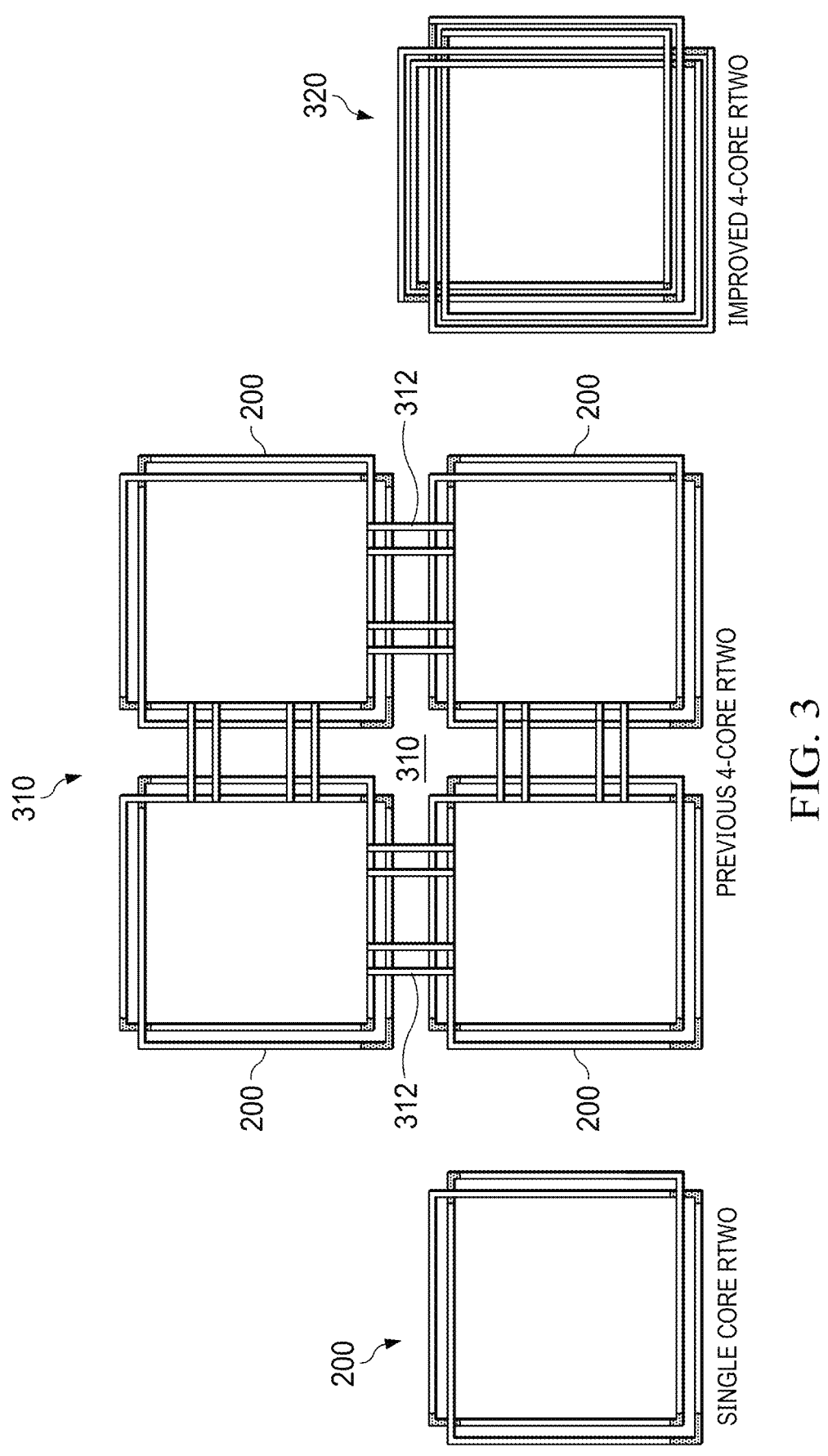
FIG. 3 illustrates a comparative layout view of various configurations of Rotary Traveling Wave Oscillators to depict area efficiency in accordance with some embodiments.

FIG. 3 illustrates a comparative layout view of various configurations of RTWOs to depict comparative area efficiency in accordance with some embodiments. In particular, FIG. 3 shows a single-core RTWO 200, a conventional 4-core RTWO 310, and an improved 4-core RTWO 320 in accordance with embodiments described herein.

On the left side of FIG. 3, single-core RTWO 200 operates in a manner described above with respect to FIGS. 1 and 2—a differential circular transmission line and associated circuitry designed to sustain oscillatory behavior through energy restoration as the wave travels along that transmission line.

Centrally positioned in FIG. 3, a conventional 4-core RTWO configuration 310 comprises four distinct instances of the single-core RTWO 200, arranged adjacently to form a 2×2 grid layout. Each of these RTWO instances is coupled to one another via a plurality of paired connections 312, facilitating coherent operation between the instances of single-core RTWO 200 operating within the 4-core RTWO configuration 310. However, this conventional approach to constructing a 4-core RTWO inherently consumes an area approximately four times that of the single-core RTWO 200 or more, due to the arrangement of individual adjacent single-core RTWO units without area optimization considerations.

On the rightmost side of FIG. 3, a 4-core RTWO 320 is configured in accordance with the techniques disclosed herein. Unlike the conventional 4-core RTWO configuration 310, the improved 4-core RTWO 320 demonstrates a significant reduction in silicon area consumption while maintaining the functional benefits of multi-core RTWO configurations. The embodiment allows for the interleaved arrangement of transmission lines and the effective utilization of magnetic and mutual inductive and capacitive coupling between the oscillator cores, thereby eliminating the need for additional coupling tracks or devices. Generally, in an RTWO comprising N cores, with each core occupying an area A of the relevant metal layers, the improved multicore RTWO occupies a total area T of the at least two metal layers that is substantially less than N×A. Thus, the 4-core RTWO 320 achieves a compact form factor, adding only a minor area overhead compared to the single-core RTWO 200.

Figure 4:
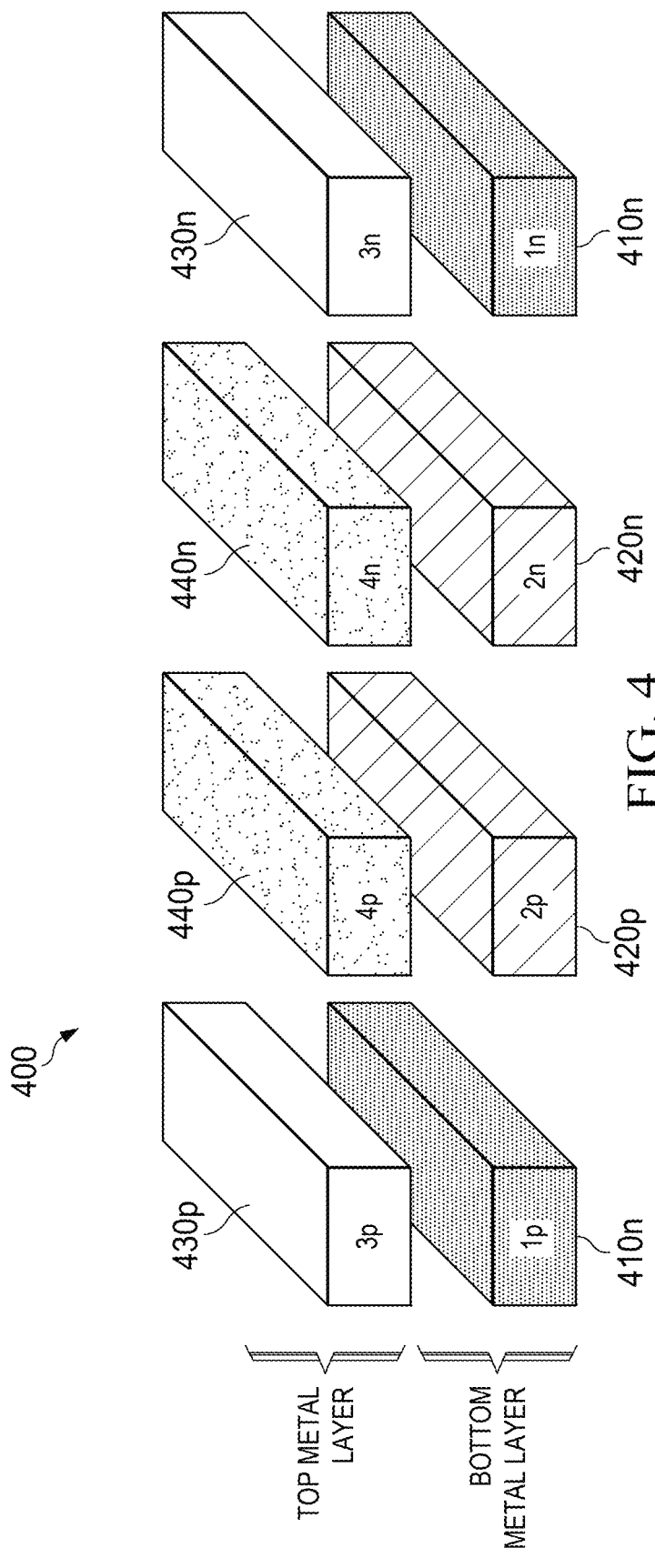
FIG. 4 illustrates a cross-sectional view of four interleaved pairs of transmission lines configured for use in a multicore RTWO configuration, in accordance with some embodiments.

FIG. 4 illustrates a cross-sectional view of four interleaved pairs of transmission lines configured for use in a 4-core RTWO configuration 400, such as the 4-core RTWO 320 described in FIG. 3, in accordance with some embodiments. This arrangement delineates the structuring of differential signal pairs across two metal layers to increase spatial efficiency and optimize electromagnetic coupling between the multiple cores of the RTWO.

Arranged from left to right on the bottom metal layer are conductors 410p, 420p, 420n, and 410n. Conductors 410p and 410n constitute one differential signal pair, with 410p carrying the positive phase and 410n the negative. Neighboring them, 420p and 420n form another differential pair.

On the upper metal layer, in a similar left-to-right orientation, are positioned conductors 430p, 440p, 440n, and 430n. Here, 430p and 430n make up one differential pair, and 440p and 440n compose another. The configuration of the top metal layer, mirroring that of the bottom metal layer, exploits the vertical dimension to accommodate the transmission lines.

The 'p' and 'n' suffixes respectively indicate the conductors' roles in transmitting the positive and negative phases of the differential signals, ensuring each pair effectively conveys differential signals with minimal loss and interference. The routing of these associated differential signals—either in the inner or outer positions and across the top or bottom metal layers—facilitates a balanced electromagnetic field distribution and uniform signal propagation among the eight tracks, removing the need for coupling tracks (such as paired connections 312 of FIG. 3) or coupling devices like dedicated capacitors, resistors or switches.

In certain scenarios, such configurations lead to variations in parasitic effects, such as caused by capacitance toward the substrate or neighboring tracks, which can impact performance. As used herein, parasitic effects refers to unintended and typically undesirable passive properties that arise within electronic circuits due to physical configuration of the components and interconnections. These properties can include capacitance, inductance, and resistance that occur between conductors, through the substrate, or across insulating materials, and can affect the performance of the circuit by introducing losses, noise, and unwanted feedback or interference. In the context of oscillators and other high-frequency electronic devices, parasitic effects can significantly impact the accuracy, efficiency, and stability of the device by altering signal paths and timings unexpectedly.

Returning to the example of FIG. 4, the inner bottom differential conductors 420p and 420n experience different parasitic conditions than the outer top differential conductors 430p and 430n due to their proximity to other conductive elements and the substrate. Therefore, in certain embodiments, to address these deviations and maintain balanced operation across the four nested transmission lines, the placement of the differential signals within the transmission line ring of each RTWO core is varied along the ring. This variability ensures that each differential signal encounters all possible positional permutations within the ring, thereby equalizing the overall parasitic effects experienced by the system.

Figure 5:
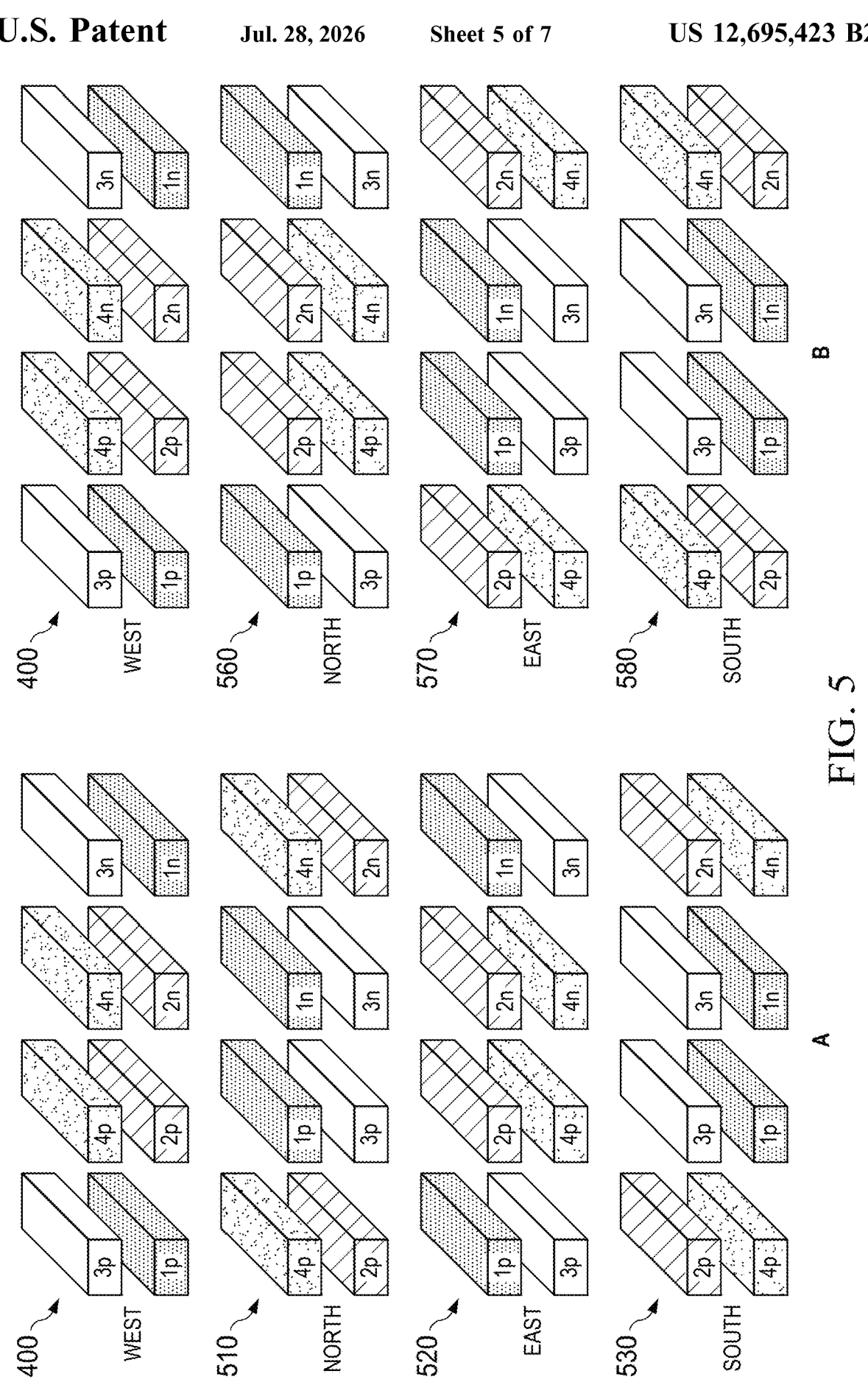
FIG. 5 illustrates two configurations for arranging differential signal conductors to counteract and equalize parasitic effects in a multi-core RTWO, in accordance with some embodiments.

FIG. 5 depicts two configurations for arranging differential signal conductors to counteract and equalize parasitic effects in a multi-core RTWO, in accordance with some embodiments. These configurations counteract and equalize parasitic effects, and illustrate the application of rotation schemes to distribute parasitic effects evenly across the oscillator, utilizing the RTWO configuration 400 from FIG. 4 as a starting point. This first configuration 400 positions the oscillator in a westward-facing track, layered across two metal layers.

Scenario A outlines a sequence of conductor relative positional arrangements as the RTWO rotates through west, north, east, and south configurations:

West (initial configuration 400) features top layer conductors 3p, 4p, 4n, 3n, and bottom layer conductors 1p, 2p, 2n, 1n.

North (configuration 510) rearranges to the top metal layer: 4p, 1p, 1n, 4n, and to the bottom metal layer: 2p, 3p, 3n, 2n. Here, while the first relative positional configuration 400 (west) includes conductors 2p, 2n positioned in an inner portion of the interleaved differential signal conductors, this second relative positional configuration 510 (north) includes those conductors 2p, 2n positioned in the outer positions of the interleaved differential signal conductors.

East (configuration 520) rearranges to the top metal layer: 1p, 2p, 2n, 1n, and to the bottom metal layer: 3p, 4p, 4n, 3n.

South (configuration 530) rearranges to the top metal layer: 2p, 3p, 3n, 2n, and bottom metal layer: 4p, 1p, 1n, 4n.

Scenario B demonstrates an alternative sequence from the same westward start:

West (400) maintains its starting arrangement with top metal layer: 3p, 4p, 4n, 3n, and bottom metal layer: 1p, 2p, 2n, 1n.

North (configuration 560) changes to top metal layer: 1p, 2p, 2n, 1n, and bottom metal layer: 3p, 4p, 4n, 3n.

East (configuration 570) then rotates to top metal layer: 2p, 1p, 1n, 2n, and bottom metal layer: 4p, 3p, 3n, 4n.

South (configuration 580) concludes with top metal layer: 4p, 3p, 3n, 4n, and bottom metal layer: 2p, 1p, 1n, 2n.

These scenarios demonstrate how the rotationally progressive configurations achieve overall symmetry along the transmission line rings, ensuring that each differential signal occupies all potential locations—whether inner or outer, and on either the top or bottom metal layers—across the four cardinal orientations (west, north, east, and south). Thus, the RTWO cores are configured for diverse positional configurations across a range of orientations across 360 degrees. This reconfiguration of relative positions between the interleaved differential signal conductors of the multicore RTWO across such an orientation range is not merely limited to arrangements within a four-core RTWO; in various embodiments, configurations involve a greater number of RTWO cores, such as by either adding more tracks to existing metal layers or incorporating additional metal layers.

In certain embodiments, a track width or spacing distance of the differential signal conductors may also be varied to further mitigate and/or otherwise control parasitic effects between such conductors, such as by being applied to all RTWO cores along their rings in a manner similar to that described and illustrated above with respect to the configurations of FIG. 5.

Figure 6:
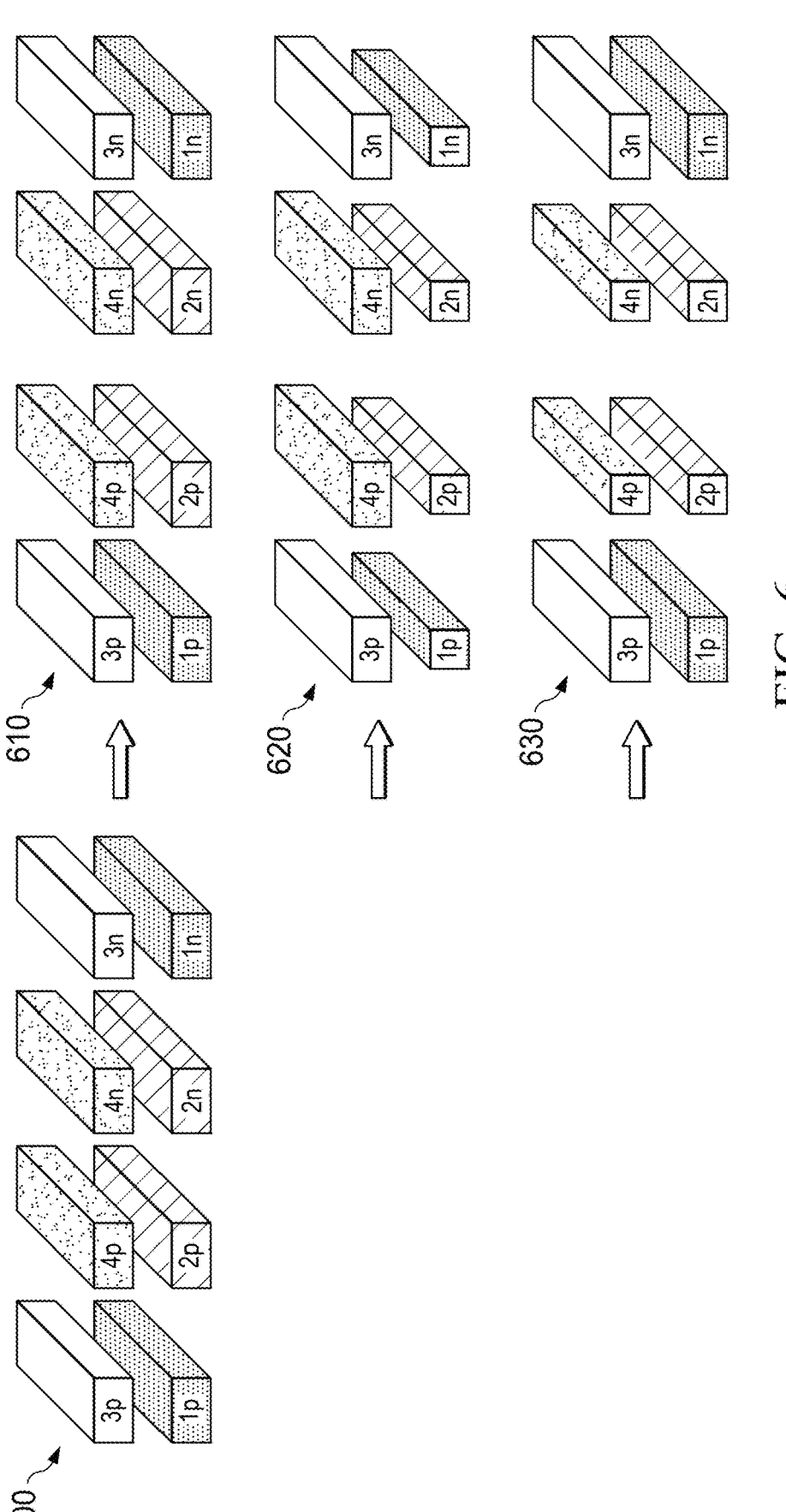
FIG. 6 illustrates three alternative differential signal conductor configurations in which the metal layer track width and/or conductor spacing distance of the differential signal conductors while preserving their relative positions, in accordance with some embodiments.

FIG. 6 illustrates three alternative differential signal conductor configurations designed to modify the track width and/or spacing distance of the differential signal conductors while preserving their relative positions as described above with respect to configuration 400 of FIGS. 4 and 5. These configurations depict non-limiting variations in the physical dimensions and spacing of the differential signal conductors in an RTWO to address the effects on capacitance and other parasitic effects, thereby improving the performance characteristics of the RTWO.

Conductor configuration 610 retains the conductor thickness of those within conductor configuration 400. However, it introduces a significantly increased spacing distance between the central conductors, specifically 4p and 4n on the top layer and 2p and 2n on the bottom layer. This increased conductor spacing affects the oscillator's parasitic profile and signal integrity without altering the conductors' cross-sectional area.

In conductor configuration 620, the conductor size and spacing between conductors on the top metal layer remain substantially identical to those in configuration 400, with each having a substantially identical cross-sectional area. However, the conductors on the bottom metal layer have a significantly reduced cross-sectional area and correspondingly increased spacing distance between tracks. These disparate conductor dimensions and inter-conductor spacing distances within the RTWO structure affects its electrical properties, and in particular its associated capacitance and parasitic effects.

Conductor configuration 630 again maintains the relative position of the differential signal conductors as delineated in configuration 400. However, the cross-sectional area of the central conductors (4p and 4n on the top layer and 2p and 2n on the bottom layer) is significantly reduced with respect to that of the outer conductors (3p and 3n on the top layer, 1p and 1n on the bottom layer). This arrangement again affects the differential signal conductor capacitance and parasitic effects, and therefore the overall performance of the RTWO and its internal signal propagation.

It will be appreciated that the differences in conductor widths and track spacing illustrated in the configurations 610, 620, 630 are merely examples, and that in various embodiments additional configurations with such differences are utilized. Moreover, such variations in conductor widths and track spacing may be utilized in conjunction with the configuration changes associated with orientation shifts from west to north, east, and south, as described above with respect the conductor configurations of FIG. 5.

Figure 7:
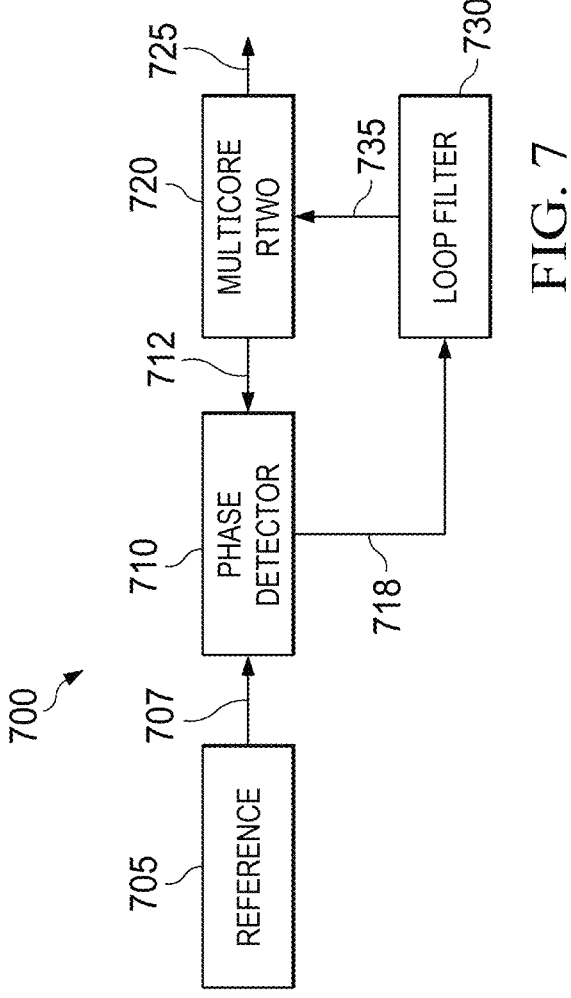
FIG. 7 illustrates a phase locked loop circuit for generating a frequency signal utilizing a multicore RTWO, in accordance with some embodiments.

FIG. 7 illustrates a phase-locked loop (PLL) circuit 700 for generating a frequency signal in a system incorporating a multicore RTWO, in accordance with some embodiments. The PLL circuit includes a multicore RTWO 720, which comprises at least two metal layers and a plurality of RTWO cores such that, as described in greater detail elsewhere herein, each core comprises a set of differential signal conductors that are interleaved across the metal layers.

In the depicted embodiment, a reference signal 705, originating from a stable frequency source, provides a reference frequency 707 to a phase detector 710. The phase detector 710 compares the phase of the oscillator output signal 712 from the multicore RTWO 720 against the reference frequency 707, and generates an error signal 718 (which in various embodiments is a voltage signal, current signal, or digital signal) as an indication of any phase misalignment. This error signal 718 is then smoothed by a loop filter 730, which conditions the signal to produce control signal 735. The control signal 735 is fed back to the multicore RTWO 720, which adjusts its oscillation frequency to reduce phase errors, thereby enhancing the stability and accuracy of the output signal. The multicore RTWO 720, operating in a manner substantially identical to the 4-core RTWO 320 of FIG. 3, provides not only the feedback oscillator output signal 712 to the phase detector 710 but also outputs a frequency signal 725 for subsequent use, such as in communication, signal processing, or other frequency-sensitive applications.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A multicore rotary traveling wave oscillator (RTWO), comprising:

at least two metal layers; and a plurality of RTWO cores, wherein each RTWO core of the plurality of RTWO cores comprises a set of differential signal conductors, wherein a first subset of the differential signal conductors for the plurality of RTWO cores have a first cross-sectional area, wherein a second subset of the differential signal conductors for the plurality of RTWO cores have a second cross-sectional area that is different than the first cross-sectional area, and wherein the differential signal conductors for the plurality of RTWO cores are interleaved via the at least two metal layers.

2. The multicore RTWO of claim 1, wherein the set of differential signal conductors for each RTWO core is oriented across a range of directions, and wherein the interleaved differential signal conductors for the plurality of RTWO cores have a first relative positional configuration where the interleaved differential signal conductors are substantially oriented in a first direction, and a different second relative positional configuration where the interleaved differential signal conductors are substantially oriented in a second direction.

3. The multicore RTWO of claim 2, wherein the range of directions comprises 360 degrees.

4. The multicore RTWO of claim 2, wherein the first relative positional configuration includes multiple conductors positioned in an inner portion of the interleaved differential signal conductors for the plurality of RTWO cores, and wherein the second relative positional configuration includes at least one of the multiple conductors positioned in an outer portion of the interleaved differential signal conductors.

5. The multicore RTWO of claim 1, wherein the differential signal conductors with the first cross-sectional area are positioned on an inner track of the at least two metal layers and the differential signal conductors with the second cross-sectional area are positioned on an outer track of the at least two metal layers.

6. The multicore RTWO of claim 1, wherein the first subset of the differential signal conductors for the plurality of RTWO cores have a first spacing distance between conductors, and wherein the second subset of the differential signal conductors have a second spacing distance between conductors that is different than the first spacing distance.

7. The multicore RTWO of claim 1, wherein the RTWO is configured to, responsive to a control signal, activate a first subset of RTWO cores of the plurality of the RTWO cores while a second subset of the plurality of RTWO cores is inactive.

8. The multicore RTWO of claim 1, wherein the RTWO is configured to, responsive to a control signal, deactivate a first subset of the plurality of the RTWO cores while a second subset of the plurality of RTWO cores continues operation.

9. The multicore RTWO of claim 1, wherein the plurality of RTWO cores comprises N RTWO cores, wherein each RTWO core of the plurality of RTWO cores occupies an area A of the at least two metal layers, and wherein the multicore RTWO occupies a total area T of the at least two metal layers that is less than N×A.

10. A system, comprising:

a multicore rotary traveling wave oscillator (RTWO) comprising at least two metal layers and a plurality of RTWO cores, wherein each core comprises a set of differential signal conductors, wherein a first subset of the differential signal conductors for the plurality of RTWO cores have a first cross-sectional area, wherein a second subset of the differential signal conductors for the plurality of RTWO cores has a second cross-sectional area that is different than the first cross-sectional area, and wherein the differential signal conductors for the plurality of RTWO cores are interleaved via the at least two metal layers; and a phase-locked loop (PLL) circuit coupled to the RTWO, the PLL circuit to stabilize a frequency of one or more RTWO signals generated by the RTWO by comparing a phase of the one or more RTWO signals with a reference signal.

11. The system of claim 10, wherein the set of differential signal conductors for each RTWO core is oriented across a range of directions, and wherein the interleaved differential signal conductors for the plurality of RTWO cores have a first relative positional configuration where substantially oriented in a first direction, and have a different second relative positional configuration where substantially oriented in a second direction.

12. The system of claim 11, wherein the range of directions comprises 360 degrees.

13. The system of claim 11, wherein the first relative positional configuration includes multiple conductors positioned in an inner portion of the interleaved differential signal conductors for the plurality of RTWO cores, and wherein the second relative positional configuration includes at least one of the multiple conductors positioned in an outer portion of the interleaved differential signal conductors.

14. The system of claim 11, wherein the first relative positional configuration includes multiple conductors positioned in a first metal layer of the at least two metal layers, and wherein the second relative positional configuration includes at least one of the multiple conductors positioned in a second metal layer of the at least two metal layers.

15. The system of claim 10, wherein the differential signal conductors with the first cross-sectional area are positioned on an inner track of the at least two metal layers, and wherein the differential signal conductors with the second cross-sectional area are positioned on an outer track of the at least two metal layers.

16. The system of claim 10, wherein the first subset of the differential signal conductors for the plurality of RTWO cores have a first spacing distance between conductors, and wherein the second subset of the differential signal conductors have a second spacing distance between conductors that is different than the first spacing distance.

17. The system of claim 10, further comprising a controller to selectively activate or deactivate a subset of one or more RTWO cores of the plurality of the RTWO cores.

18. The system of claim 10, wherein the plurality of RTWO cores comprises N RTWO cores, wherein each RTWO core of the plurality of RTWO cores occupies an area A of the at least two metal layers, and wherein the multicore RTWO occupies a total area T of the at least two metal layers that is less than $N \times A$.

19. A method, comprising:

generating an oscillator output signal using a multicore rotary traveling wave oscillator (RTWO), the multicore RTWO comprising at least two metal layers and a plurality of RTWO cores, each RTWO core comprising a first subset of differential signal conductors having a first cross-sectional area and a second subset of differential signal conductors having a second cross-sectional area, the first cross-sectional area being different than the second cross-sectional area and the differential signal conductors for the plurality of RTWO cores being interleaved via the at least two metal layers; and adjusting a frequency of the oscillator output signal based on a comparison of a phase of the oscillator output signal with a reference signal.

\* \* \* \* \*